United States Patent
Baggen et al.

(10) Patent No.: US 8,014,881 B2
(45) Date of Patent: Sep. 6, 2011

(54) LITHOGRAPHIC APPARATUS AND DEVICE MANUFACTURING METHOD

(75) Inventors: Mark Constant Johannes Baggen, Eindhoven (NL); Petrus Marinus Christianus Maria Van Den Biggelaar, Nuenen (NL); Yin Tim Tso, Eindhoven (NL); Marcel François Heertjes, Best (NL); Ramidin Izair Kamidi, Eindhoven (NL); Dennis Andreas Petrus Hubertina Houben, Maastricht (NL); Constant Paul Marie Jozef Baggen, Venlo-Blerick (NL); Marinus Jacobus Gerardus Van De Molengraft, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 437 days.

(21) Appl. No.: 11/706,422

(22) Filed: Feb. 15, 2007

(65) Prior Publication Data

US 2008/0200998 A1    Aug. 21, 2008

(51) Int. Cl.
  *G05B 13/02*   (2006.01)
  *B41F 1/18*    (2006.01)
  *C11D 7/26*    (2006.01)
  *H03L 7/00*    (2006.01)
  *G03B 27/72*   (2006.01)
  *G03C 1/06*    (2006.01)

(52) U.S. Cl. ....... 700/44; 101/450.1; 510/171; 327/154; 355/69; 430/265

(58) Field of Classification Search .......... 700/44; 355/69; 101/450.1; 430/265; 510/171; 327/154
See application file for complete search history.

(56) References Cited

U.S. PATENT DOCUMENTS

| | | | | |
|---|---|---|---|---|
| 4,582,026 A * | 4/1986 | Takita et al. | ............... | 122/448.1 |
| 5,073,747 A * | 12/1991 | Dupraz et al. | ............... | 318/561 |
| 5,216,342 A * | 6/1993 | Torii et al. | ............... | 318/568.1 |
| 5,371,451 A | 12/1994 | Toyosawa et al. | | |
| 6,008,610 A | 12/1999 | Yuan et al. | | |
| 6,260,282 B1 | 7/2001 | Yuan et al. | | |
| 6,584,048 B1 * | 6/2003 | Tateishi et al. | ............... | 369/44.28 |
| 6,711,598 B1 * | 3/2004 | Pare et al. | ............... | 708/300 |

(Continued)

FOREIGN PATENT DOCUMENTS

JP    03-235687 A    10/1991

(Continued)

OTHER PUBLICATIONS

Heertjes et al., "Nonlinear Control of Optical Storage Drives with Improved Shock Performance", 2005, Control Engineering Practices, vol. 13, pp. 1295-1305.*

(Continued)

*Primary Examiner* — Albert Decady
*Assistant Examiner* — Thomas Stevens
(74) *Attorney, Agent, or Firm* — Sterne, Kessler, Goldstein & Fox P.L.L.C.

(57) ABSTRACT

In a lithographic apparatus, a feedforward transfer function of a control system is determined by: a) iteratively learning a feedforward output signal of the control system by iterative learning control for a given setpoint signal; b) determining a relation between the learned feedforward output signal and the setpoint signal; and c) applying the relation as the feedforward transfer function of the control system. A learned feedforward, which has been learned for one or more specific setpoint signals only, can be adapted to provide a setpoint signal dependent feedforward output signal. The learned feedforward can be made more robust against setpoint variations.

27 Claims, 7 Drawing Sheets

U.S. PATENT DOCUMENTS

| | | | |
|---|---|---|---|
| 6,727,977 B2* | 4/2004 | Butler | 355/53 |
| 6,825,631 B1* | 11/2004 | Nakamura | 318/560 |
| 7,057,705 B2 | 6/2006 | Heintze | |
| 7,064,512 B2 | 6/2006 | Kimura | |
| 7,170,581 B2 | 1/2007 | Tousain | |
| 7,209,219 B2 | 4/2007 | Butler | |
| 7,265,813 B2* | 9/2007 | Houkes et al. | 355/53 |
| 7,289,858 B2* | 10/2007 | Van Donkelaar et al. | 700/45 |
| 7,468,782 B2 | 12/2008 | Butler | |
| 2003/0014144 A1* | 1/2003 | Krivokapic et al. | 700/121 |
| 2003/0144746 A1* | 7/2003 | Hsiung et al. | 700/28 |
| 2005/0043834 A1* | 2/2005 | Rotariu et al. | 700/95 |
| 2005/0222728 A1* | 10/2005 | Hac et al. | 701/38 |
| 2007/0146675 A1* | 6/2007 | Butler | 355/69 |
| 2008/0279059 A1 | 11/2008 | Zhou | |

FOREIGN PATENT DOCUMENTS

| | | | |
|---|---|---|---|
| JP | 04-323706 A | 11/1992 | |
| JP | 08-123553 A | 5/1996 | |
| JP | 2000-036531 A | 2/2000 | |
| JP | 2003-115450 A | 4/2003 | |
| JP | 2003-256048 A | 9/2003 | |
| JP | 2003-264134 A | 9/2003 | |
| JP | 2003-330545 A | 11/2003 | |
| JP | 2003-332233 A | 11/2003 | |
| JP | 2004-311904 A | 11/2004 | |
| JP | 2004-342082 A | 12/2004 | |
| JP | 2005-303196 A | 10/2005 | |
| JP | 2005-322720 A | 11/2005 | |
| JP | 2005-354088 A | 12/2005 | |
| JP | 2006-128685 A | 5/2006 | |
| JP | 2006-191055 A | 7/2006 | |
| JP | 2006-310849 A | 11/2006 | |
| JP | 2009-501401 A | 1/2009 | |
| WO | WO 2004/074951 A1 | 9/2004 | |

OTHER PUBLICATIONS

Search Report and Written Opinion for European Application No. 08075116.7-2206/1962157 mailed Aug. 3, 2009, 8 pgs.

Potsaid et al., "High Performance Motion Tracking Control", Control Applications, 2004, Proceedings of the 2004 IEEE International Conference on Taipei, Taiwan, Sep. 2-4, 2004, Piscataway, NJ, USA, IEEE, vol. 1, Sep. 2, 2004, pp. 718-723, ISBN: 978-0-7803-8633-4.

Barton et al., "Cross-Coupled Iterative Learning Control: Design and Implementation", Proceedings of IMECE 2006, ASME International Mechanical Engineering Congress and Exposition; Nov. 5-10, 2006, Chicago, Illinois, USA, ASME, Nov. 5, 2006, pp. 223-233, ISBN: 978-0-7918-4774-9.

Bristow et al., "A Survey of Iterative Learning Control", IEEE Control Systems Magazine, vol. 26, No. 3, Jun. 2006, pp. 96-114, XP002534965, USA, ISSN: 0272-1708.

Australian Examination Report dated Jun. 8, 2010, 7 pages.

English-Language Abstract for JP 03-235687 A, published Oct. 21, 1991; 1 page, 17 pg.

English-Language Abstract for JP 04-323706 A, published Nov. 12, 1992; 1 page, 7 pg.

English-Language Abstract for JP 08-123553 A, published May 17, 1996; 1 page, 10 pg.

English-Language Abstract for JP 2000-036531 A, published Feb. 2, 2000; 1 page, 14 pg.

English-Language Abstract for JP 2003-115450 A, published Apr. 18, 2003; 1 page, 38 pg.

English-Language Abstract for JP 2003-256048 A, published Sep. 10, 2003; 1 page, 29 pg.

English-Language Abstract for JP 2003-264134 A, published Sep. 19, 2003; 1 page, 15 pg.

English-Language Abstract for JP 2003-330545 A, published Nov. 21, 2003; 1 page, 8 pg.

English-Language Abstract for JP 2003-332233 A, published Nov. 21, 2003; 1 page, 15 pg.

English-Language Abstract for JP 2004-311904 A, published Nov. 4, 2004; 1 page, 22 pg.

English-Language Abstract for JP 2004-342082 A, published Dec. 2, 2004; 1 page, 37 pg.

English-Language Abstract for JP 2005-303196 A, published Oct. 27, 2005; 1 page, 11 pg.

English-Language Abstract for JP 2005-322720 A, published Nov. 17, 2005; 1 page, 25 pg.

English-Language Abstract for JP 2005-354088 A, published Dec. 22, 2005; 1 pages, 53 pg.

English-Language Abstract for JP 2006-128685 A, published May 18, 2006; 1 pages, 29 pg.

English-Language Abstract for JP 2006-191055 A, published Jul. 20, 2006; 1 page, 18 pg.

English-Language Abstract for JP 2006-310849 A, published Nov. 9, 2006; 1 page, 19 pg.

Dijkstra, B.G., et al., "Extrapolation of optimal lifted system ILC solution, with application to a waferstage," Proceedings of the American Control Conference, 2595-2600, Anchorage, United States, May 8-10, 2002, 7 pages.

Dijkstra, B.G., et al., "Exploiting Iterative Learning Control for Input Shaping, with application to a wafer stage," Proceedings of the American Control Conference, 4811-4815, Denver, United States, Jun. 4-6, 2003, 6 pages.

Potsaid, B., et al., "High Performance Motion Tracking Control," Proceedings of the 2004 IEEE, 718-723, Taipei, Taiwan, Sep. 2-4, 2004, 7 pages.

English Translation of Notice of Reasons for Rejection directed to related Japanese Patent Application No. 2008-028927, mailed on Jan. 11, 2011, from the Japanese Patent Office; 4 pages.

* cited by examiner

LITHOGRAPHIC APPARATUS AND DEVICE MANUFACTURING METHOD

BACKGROUND

1. Field of the Invention

The present invention relates to a method to determine a feedforward transfer function of a control system in a lithographic apparatus, a lithographic apparatus and a method for manufacturing a device.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

As an example, in a so called step and scan lithographic apparatus, both reticle stage and wafer stage perform step- and scan moves at nanometer scale accuracy. Throughput demands require high velocity and acceleration levels. These high acceleration levels may be conflicting with a demand for position accuracy as dynamics of the stages are excited during acceleration phases. Vibrations need to settle in a certain settling time before exposure can begin. To address these needs, sophisticated motion control is used to control 6 degrees of freedom (6 DOF) of mechanics of both reticle- and waferstage. Feedback control is used to guard stability and improve disturbance rejection, while feedforward control is used to achieve the desired tracking performance.

In the past years, iterative learning control has been considered to determine a feedforward signal in controlling a position related quantity (such as a position, a velocity, a jerk, etc) of a stage (such as a substrate stage or a reticle stage) of a lithographic apparatus. In a combined feedforward/feedback control system, iterative learning control provides for a learning of the feedforward signal by providing a setpoint stimulus to the control system, applying an initial or previously determined feedforward signal, measuring an error signal expressing a difference between a desired response of the stage and a measured or obtained response of the stage, and determining a following or subsequent feedforward signal from the error signal and the feedforward signal as applied. This process may be repeated iteratively, until a number of iterations has been achieved, or any other suitable criterion has been met, such as a convergence of the feedforward signal, a magnitude or norm of a remaining error signal, etc. Thus, in iterative learning control, an update is made to the feedforward signal off-line based on a measured error signal. After a few trials (iterations) a stable ILC converges to an ideal feedforward signal, which provides an ability to remove or at least reduce a repetitive tracking error.

Despite benefits that may be provided by application of iterative learning control, a limitation of it may be that such learned signal only holds for a particular setpoint (e.g. a setpoint versus time pattern corresponding to a stage movement pattern), being the setpoint that has been applied during the iterative learning. When the setpoint changes, system dynamics are excited differently. It is considered too time consuming, or even impossible to learn every possible occurring setpoint profile, because variations may be so numerous that almost infinitely many setpoint profiles may occur. This aspect is even aggravated in multi input, multi output systems, as there, a variety in setpoint profiles may increase as compared to a single input, single output system. Thus, it would be desirable to use the learned information from a limited amount of learned setpoints.

SUMMARY

It is desirable to enable an improvement in robustness of iterative learning control systems against setpoint variations.

According to an embodiment of the invention, there is provided a method to, in a lithographic apparatus, determine a feedforward transfer function of a control system, the method including a) iteratively learning by iterative learning control for a given setpoint signal a feedforward output signal of the control system; b) determining a relation between the learned feedforward output signal and the setpoint signal; and c) applying the relation as the feedforward transfer function of the control system.

In another embodiment of the invention, there is provided a lithographic apparatus including: a processing device to determine a feedforward transfer function of a control system, the processing device being provided with program instructions to: a) iteratively learn by iterative learning control for a given setpoint signal a feedforward output signal of the control system; b) determine a relation between the learned feedforward output signal and the setpoint signal; and c) apply the relation as the feedforward transfer function of the control system.

According to a further embodiment of the invention, there is provided a method for manufacturing a device, including: projecting by an irradiation beam a pattern from a patterning device onto a substrate; developing the irradiated substrate; and manufacturing a device from the developed substrate, wherein at least one of the patterning device and the substrate is held by a stage, a position of the stage being controlled by a control system having a feedforward transfer function, the feedforward transfer function being determined by: a) iteratively learning by iterative learning control for a given setpoint signal a feedforward output signal of the control system; b) determining a relation between the learned feedforward output signal and the setpoint signal; and c) applying the relation as the feedforward transfer function of the control system.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
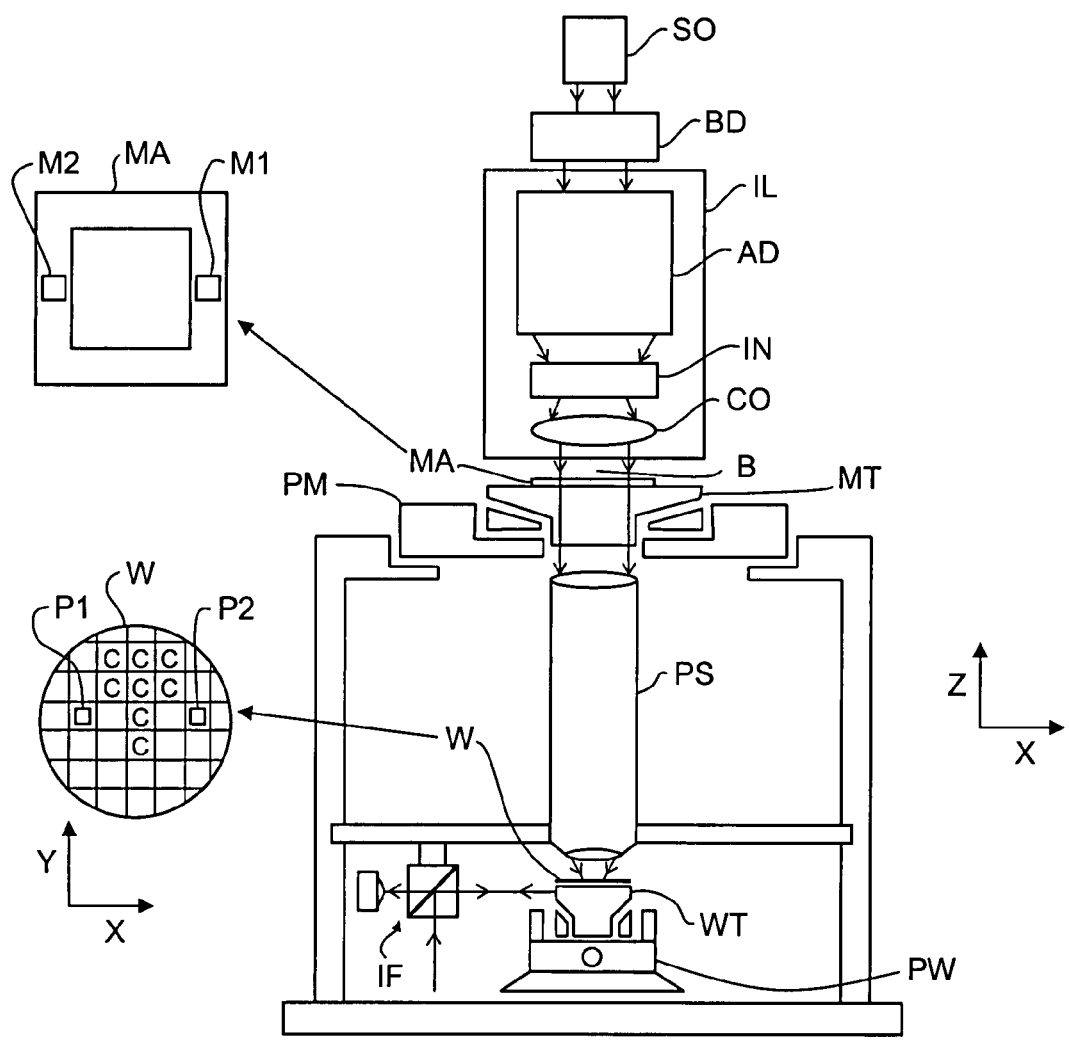
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support structure (e.g. a mask table or mask support) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support structure (e.g., mask table or mask support) supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The patterning device support structure can use mechanical, vacuum, electrostatic or other clamping techniques to hold the patterning device. The patterning device support structure may be a frame or a table, for example, which may be fixed or movable as required. The patterning device support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more patterning device tables or "patterning device supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively)

of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the patterning device support structure (e.g., mask table MT), and is patterned by the patterning device. Having traversed the patterning device MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device MA with respect to the path of the radiation beam B, e.g. after mechanical retrieval from a mask library, or during a scan. In general, movement of the patterning device table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device table MT may be connected to a short-stroke actuator only, or may be fixed. Patterning device MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the mask alignment marks may be located between the dies.

The depicted apparatus could be used in at least one of the following modes:

1. In step mode, the patterning device table MT or "patterning device support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device table MT or "patterning device support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device table MT or "patterning device" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device table MT or "patterning device support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

Figure 2:
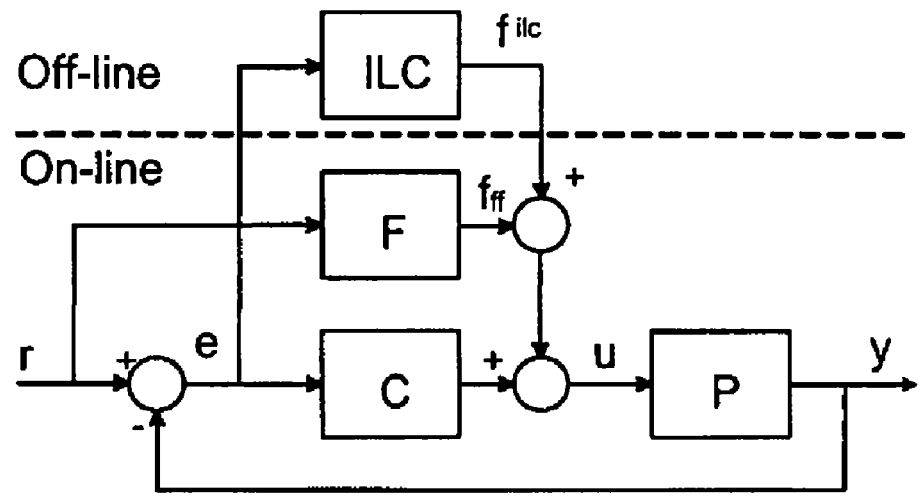
FIG. 2 depicts a diagrammatic representation of a control system to iteratively learn a feedforward output signal.

A working principle of known iterative learning control will now be described in a single input single output (SISO) control system framework. Iterative learning control may be abbreviated hereinafter as ILC. A control scheme including a feedback controller C controlling a process P such as a short-stroke patterning device stage, having a feedforward F and an ILC controller in a learning configuration, is depicted in FIG. 2. An error signal e is determined as a difference between setpoint r and measured position y, as will be explained in more detail below. This error e is fed into feedback controller C. Feedforward controller F may in this example consist of a combination of acceleration and snap feedforward and provides a feedforward signal $f_{ff}$. The ILC controller computes a feedforward output signal, in this example a force signal $f_{ilc}$ off-line based on previously measured errors. In operation, this force is added to a feedforward force from feedforward F, resulting in a more optimal feedforward operation. The learned force $f_{ilc}$ has been learned with a given setpoint r, and therefore may provide a desired feedforward during operation when a setpoint r is applied which corresponds to the learned setpoint. In case however that another setpoint is applied, the learned feedforward may provide a suboptimal solution.

Figure 3A:
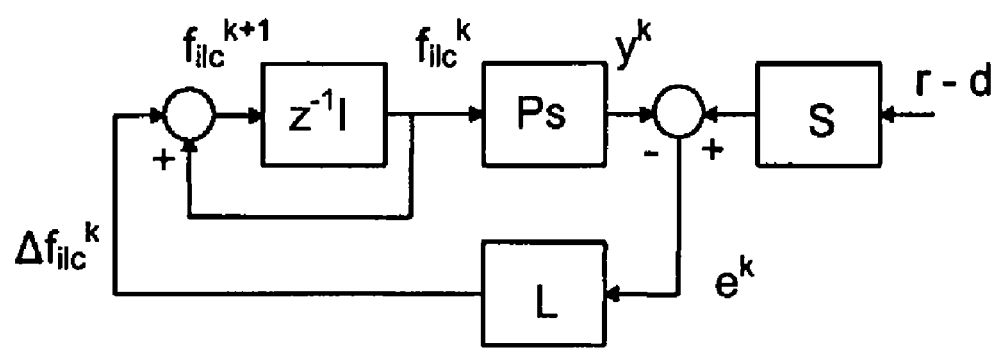
FIGS. 3A and 3B depict a control diagram and a flow diagram respectively to explain iterative learning control.

A principle of iterative learning control will now be explained in some more detail with reference to FIGS. 3A and 3B. FIG. 3A depicts a so-called lifted ILC controller in an iterative (learning) domain. Herein $e^k$ represents a matrix with error signal of a kth iteration, L represents a learning matrix, $Z^{-1}$ a one iteration delay operator, I a unitary matrix and $P_S$ matrix of the form:

$$\begin{pmatrix} h_0 & 0 & \cdots & 0 \\ h_1 & h_0 & & \\ \vdots & & \ddots & \\ h_n & h_{n-1} & & h_0 \end{pmatrix}$$

Where parameters $h_0, \ldots, h_n$ are so-called Markov parameters. Matrix $P_S$ has a Toeplitz structure representing a process sensitivity dynamics of process P, and S a Toeplitz matrix of a sensitivity dynamics.

At each iteration the error is further reduced by learning a more appropriate ILC output signal to counteract errors. This can be expressed by the following error equations in a domain of iteration (also known as trial domain):

$e^{k+1} = S(r-d) - P_S f^{k+1}$ $e^{k+1} = S(r-d) - P_S(f^k + Le^k)$ $e^{k+1} = e^k - P_S L e^k$ $e^{k+1} = (I - P_S L) e^k$

Figure 3B:
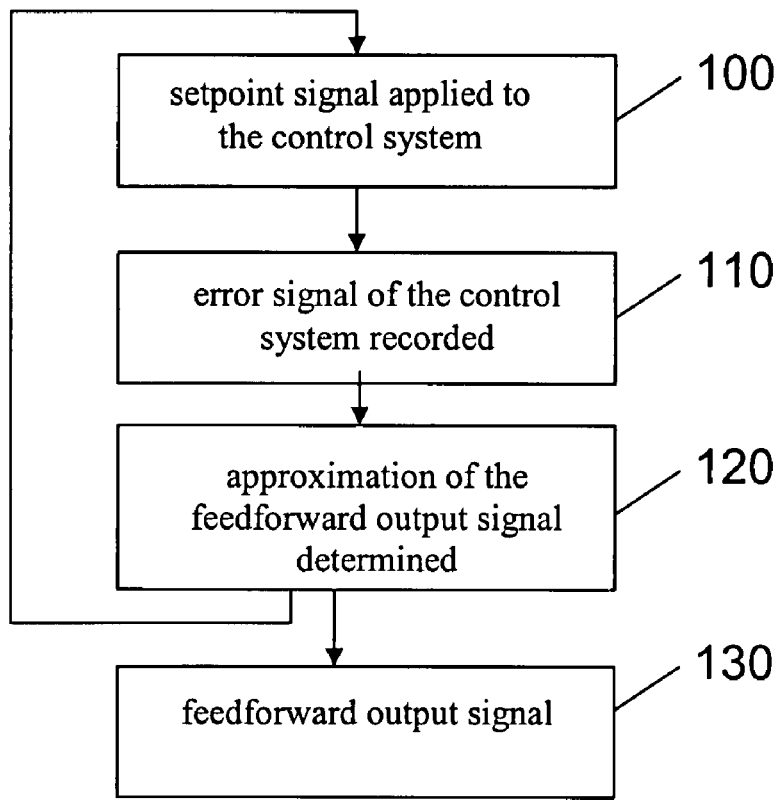

The above process is schematically depicted in FIG. 3B showing a flow diagram where in 100 the setpoint signal is applied to the control system, thereby providing as the feedforward output signal an approximation of the feedforward output signal. Then, in 110 an error signal of the control system is recorded. Next, in 120 from the error signal and the approximation of the feedforward output signal a following or subsequent approximation of the feedforward output signal is determined. As indicated by a loop in FIG. 3B, 100, 110 and 120 may be iteratively repeated applying each following or subsequent approximation of the feedforward output signal as the approximation of the feedforward output signal in a following or next repetition. After a predetermined criterion has been met (such as a number of iterations, a convergence criterium or any other suitable cirterium), the approximation thereof which has been determined in a last repetition is provided as the feedforward output signal.

It is noted that the term setpoint or setpoint profile should be understood as a setpoint over a time period, e.g. a time sequence of setpoint signal values. In the example where the control system includes a stage control system, the setpoint may include a profile representing a step and scan movement, e.g. including a sequence of acceleration, constant scanning speed, and deceleration. The setpoint may include a single quantity of a plurality of related quantities such as position, speed, acceleration etc.

The term feedforward output signal may also be understood as an output signal over time, e.g. a time sequence of feedforward signal values.

ILC may be used to converge to a feedforward output signal for a certain setpoint. This feedforward output signal is generally not optimal for other setpoints, as the thus learned feedforward output signal forms e.g. a time sequence of feedforward output values which have been learned to take account of errors occurring with the learned setpoint.

To address the above, application of a transfer function, such as a filter, as a transfer function between setpoint and ILC output signal is proposed. The transfer function may be determined from the learned ILC feedforward signal and the setpoint signal that has been applied during the learning of the ILC signal. Having determined such a relation, it allows not only for feedforward application given the setpoint that has been applied during the learning, however enables to adapt the feedforward signal towards other setpoint signals by determining the feedforward signal from the setpoint signal and the transfer function. Thereby, a sensitivity for setpoint variation may be reduced, whereas an implementation of ILC as compared to stored ILC output signal tables storing ILC output signal time sequences, may be achieved.

As an example, the relation may include a filter, such as a finite impulse response filter.

Other relations may be autoregressive (ARX), infinite impulse response (IIR), Wavelet or Fourier transformation type. An example of the above, applying as the relation a finite impulse response filter, will be provided below.

In generic terms, in a discrete time domain, the finite impulse response filter may consist of a plurality of coefficients: the coefficients, in cooperation with a plurality of setpoint values at different times in the time sequence of setpoint values, to provide the feedforward signal value at a given time.

In discrete time the above may be written as:

$$f_k^{ilc} = g_{-n1}r_{k+n1} + g_{-n1+1}r_{k+n1-1} + \cdots + g_{n2}r_{k-n2}$$

where $f_k$ represents the feedforward output signal at (sample) time k. $r_{k+n1}$ represents the setpoint value at sample time k+n1, $r_{k-n2}$ represents the setpoint value at sample time k-n2, and g-n1 represents filter coefficient -n1, while and gn2 represents filter coefficient n2. It is noted that, in this example, mapping is non-causal, as $f_k$ is a function of $r_{k+n1}$. In this example, a non-causal part of the filter is n1, whereas a causal part is n2. The above equation can also be written as a summation for a plurality $$f^{ilc}(k) = \sum_{i=-n1}^{n2} g(i)r(k-i)$$

In matrix form with R a Toeplitz matrix containing setpoint data, f a vector containing the learned feedforward signal, and g a vector with the filter coefficients:

$$\underbrace{\begin{pmatrix} f_{k1} \\ \vdots \\ \vdots \\ f_{k2} \end{pmatrix}}_{f} = \underbrace{\begin{pmatrix} r_{k1+n1} & & r_{k1-n2} \\ \vdots & \ddots & \\ \vdots & & r_{k1+n1} \\ r_{k2+n1} & & \vdots \end{pmatrix}}_{R} \underbrace{\begin{pmatrix} g_{-n1} \\ \vdots \\ \vdots \\ g_{n2} \end{pmatrix}}_{g}$$

or, $$f = R \cdot g$$

(*)

In simple terms, a set of equations now has been obtained providing as many more equations than unknown variables. This is because the setpoint values at the various sample times are known, while the iteratively learned feedforward signal is known too. Therefore, the unknown variables, i.e. the coefficients of the filter, can be determined therefrom, with a reduction of noises contained in the data points.

Using matrix calculation, the above matrix equation may be solved using a linear least squares approximation based on normal equations:

$$g = (R^T R)^{-1} R^T f$$

Once coefficients g(i) are determined, a generic relation between setpoint r and feedforward output signal has been determined. Preferably, k>>n (k is much larger than n), in other words a total number of discrete time setpoint output values of the setpoint is larger (more preferably significantly larger) than a number of coefficients in the determined relation. Therefore, apart from the possible benefits explained above, a data amount reduction may be achieved which may be beneficial from an implementation point of view.

Figure 5A:
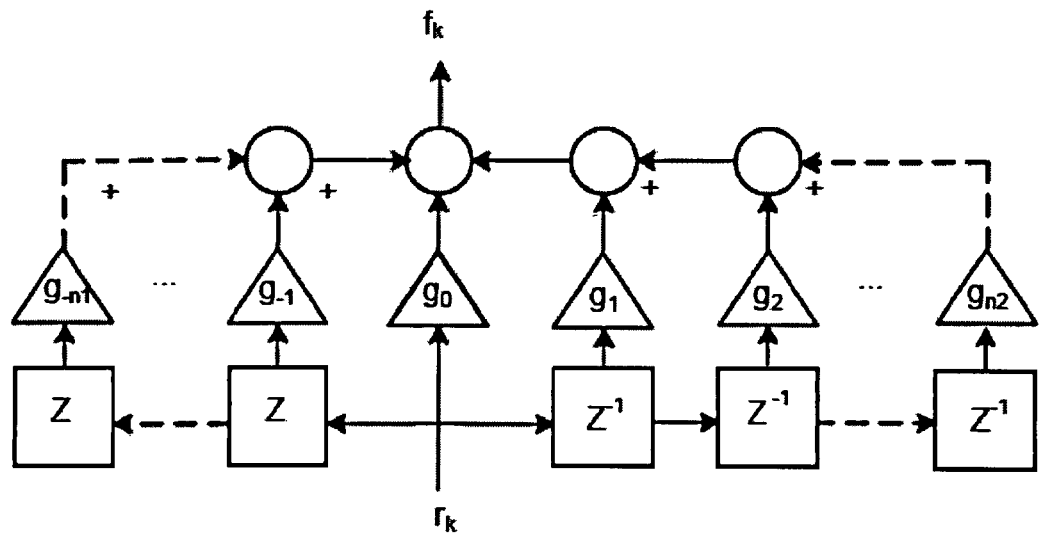
FIGS. 5A and 5B respectively depict a diagrammatic representation of a finite impulse response filter and a flow diagram illustrating actions to determine the finite impulse response or other relation.
Figure 5B:
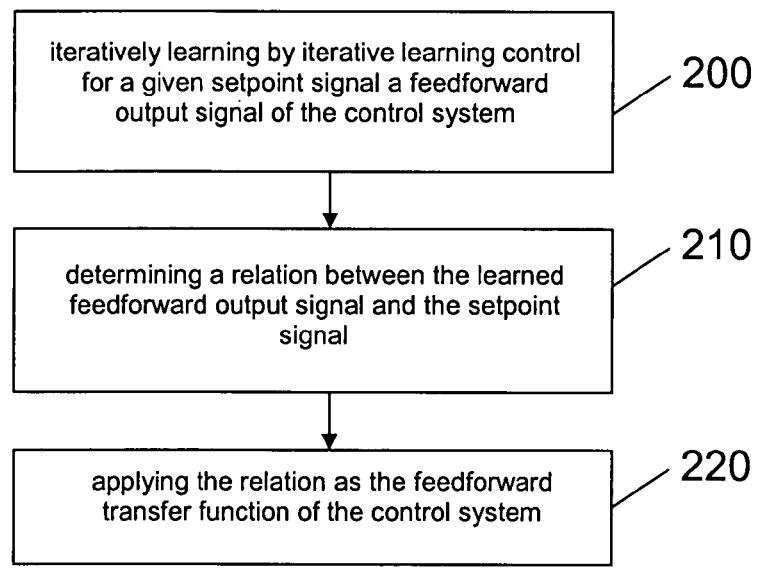

The described process may be summarized, referring to FIG. 5B, by: iteratively learning by iterative learning control for a given setpoint signal a feedforward output signal of the control system (block 200), determining a relation between the learned feedforward output signal and the setpoint signal (block 210); and applying the relation as the feedforward transfer function of the control system (block 220).

Figure 4:
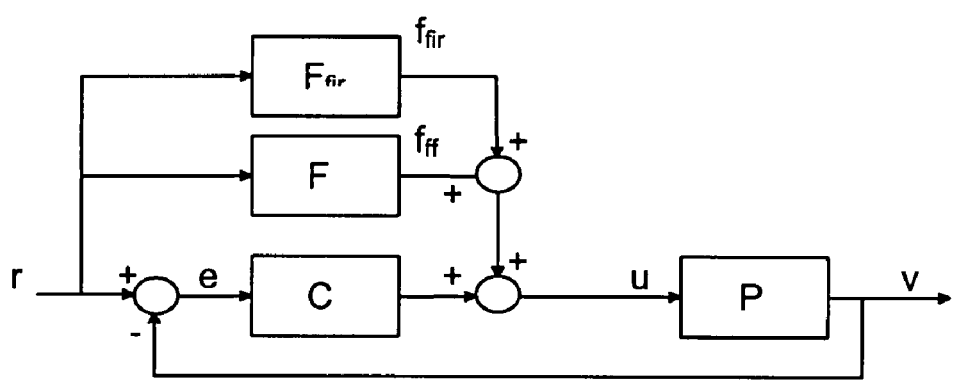
FIG. 4 depicts a diagrammatic representation of a control system including dual feedforward paths.

The relation that has been determined between the setpoint signal and the learned feedforward output signal, which in the above example forms a finite impulse response (abbreviated as FIR) filter, can be applied in a feedforward controller with a FIR filter $F_{fir}$ parallel to a known feedforward F, as shown in FIG. 4. By using dual feedforwards, accuracy may be improved as the FIR filter derived from the learned feedforward will function to reduce remaining errors from the known feedforward. FIR filters may be easy to program and they are inherently stable. In another example the FIR filter may be used as a sole feedforward.

The FIR filter $F_{fir}$ may include a structure as schematically depicted in FIG. 5A, with $Z^{-1}$ representing a one sample time delay operator, Z represents an inverse thereof, i.e. a one sample time lead operator, and the coefficients g representing the coefficients of the finite impulse response filter.

When determining the relationship in a form of a FIR, an estimation of a number of coefficients can be made by deriving a time length (expressed in e.g. a number of sample times) from the iteratively determined feedforward output signal. When the iteratively learned output signal shows a response to a change in a value of the reference signal, the time length in number of sample times of the response can be derived therefrom and applied as a time length of the finite impulse response filter. In a discrete time domain, the time length may be expressed in a number of sample number of sample times (thus number of unit delay times of the unit delay operator depicted in FIG. 5A), providing a number of coefficients and thus a time length of the relation such as the finite impulse response filter. Also, it can be determined if the finite impulse response filter may be made acausal: in case that the iteratively learned feedforward output signal appears to anticipate a change in the setpoint signal, an acausal time length of this anticipation can be used to determine a number of coefficients expressing such acausality. As an example: presume that a step response in the setpoint signal results in an iteratively learned feedforward which provides a feedforward output signal starting to react to the step response 5 sample times before such step, and maintaining active 10 sample times after the step, then a relation may be defined having 15 coefficients forming a FIR filter having 5 acausal and 10 causal coefficients.

In case of a start-up of an acausal filter, setpoint values from the past would be needed, which may not be available. Zeroes may be inserted for possibly unknown or unavailable setpoint signal values r from the past, filling the right upper triangular or R with zeroes.

To be able to perform non-causal filtering, the setpoint r should be known a few samples ahead. This may be realized in practice by delaying the setpoint a few samples before feeding into the control loop, or by reading out a setpoint signal time sequence a few samples earlier and delaying it to provide the setpoint signal or reading out the sequence again some samples later. The FIR filter can use a time difference obtained thereby to become acausal. Note that, in case of a delay of the setpoint signal, such introduced delay is only encountered once during startup, and thus has no negative effects on e.g. a throughput of a lithographic apparatus equipped with such feedforward.

In an embodiment, iteratively learned feedforward output signals from different setpoints can be used to determine the FIR filter:

$$\begin{pmatrix} f_1 \\ f_2 \\ f_3 \end{pmatrix} = \begin{pmatrix} R_1 \\ R_2 \\ R_3 \end{pmatrix} (g)$$

The use of different setpoints as training data gives an average over different excitations making the filter more robust against setpoint variations.

Thus, in an embodiment use can be made of two (or more) feedforward output signals which are each iteratively learned for respective setpoint signals. Then, the relation is determined from the learned feedforward signals and the respective setpoint signals.

The process of learning a feedforward from several setpoints and using the learned data to train a FIR filter will be described below using an example. In this example, use is made of a Reticle Stage y-direction positioning control system. Three different setpoints with varying velocity and displacement values are used to train the filter:

|  | Start | End | Velocity | Acceleration | Jerk |
| --- | --- | --- | --- | --- | --- |
| Train Move 1 | −0.12 | 0.12 | 2.2 | 69 | 8000 |
| Train Move 2 | −0.11 | 0.11 | 2.0 | 69 | 8000 |
| Train Move 3 | −0.08 | 0.08 | 1.6 | 69 | 8000 |
| Test Move 1 | −0.1 | 0.1 | 1.8 | 69 | 8000 |

Figure 6:
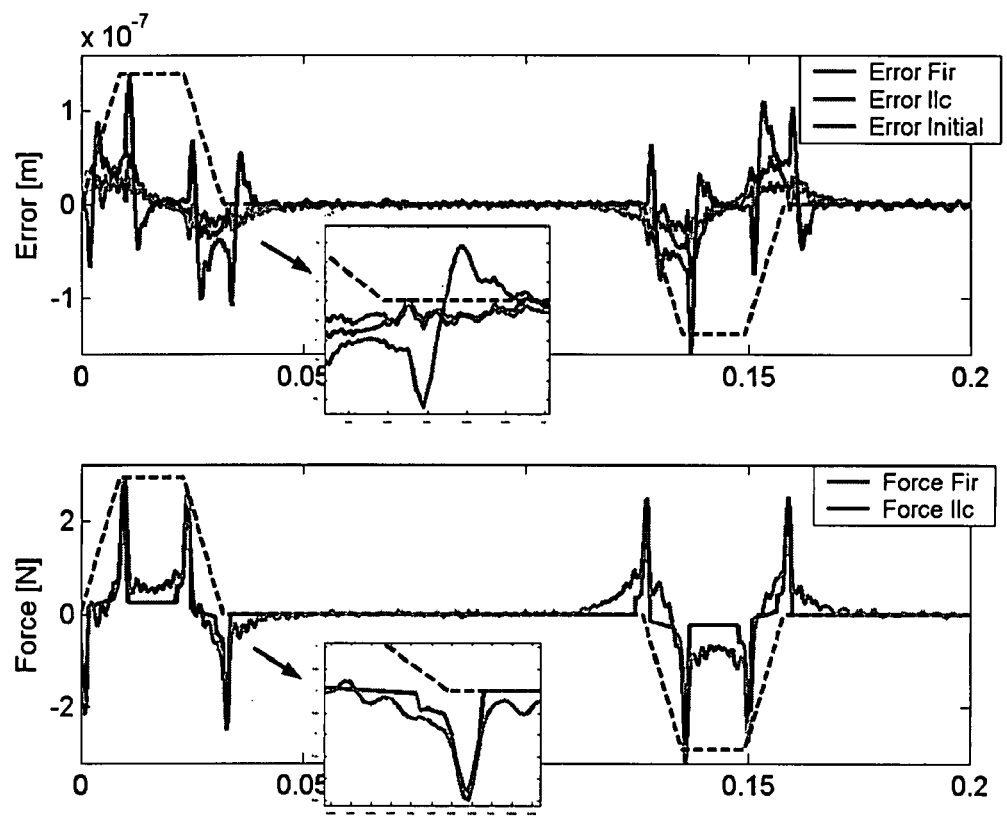
FIG. 6 depicts time diagrams of unfiltered errors and force of a stage positioning example.

Filter performance is then evaluated with a test move at a setpoint that is different in both velocity and displacement from the training setpoints such that a proper validation is provided. These variations may cover possible variations that may occur in practice. Results are shown in FIG. 6. The setpoint signal, in this example representing an acceleration of the stage, is represented by a discontinuous line. As a reference, an initial error is plotted with normal feedforward only. An error achieved with an additional ILC feedforward signal after 15 iterations at the testing setpoint is indicated as well. Now, from the learned feedforward, an FIR filter is determined according to the above procedure. A tracking error after applying the FIR filter as a feedforward, is represented by "Error Fir" in FIG. 15. It may be observed that the FIR filter realizes a performance, in other words, provides for a remaining error which is comparable to the remaining error that could have been achieved with the iteratively learned feedforward signal, be it that the FIR filter makes the feedforward more robust against variation in the setpoint signal, as the to be applied setpoint signal is fed to the FIR filter to calculate the feedforward output signal.

Figure 7:
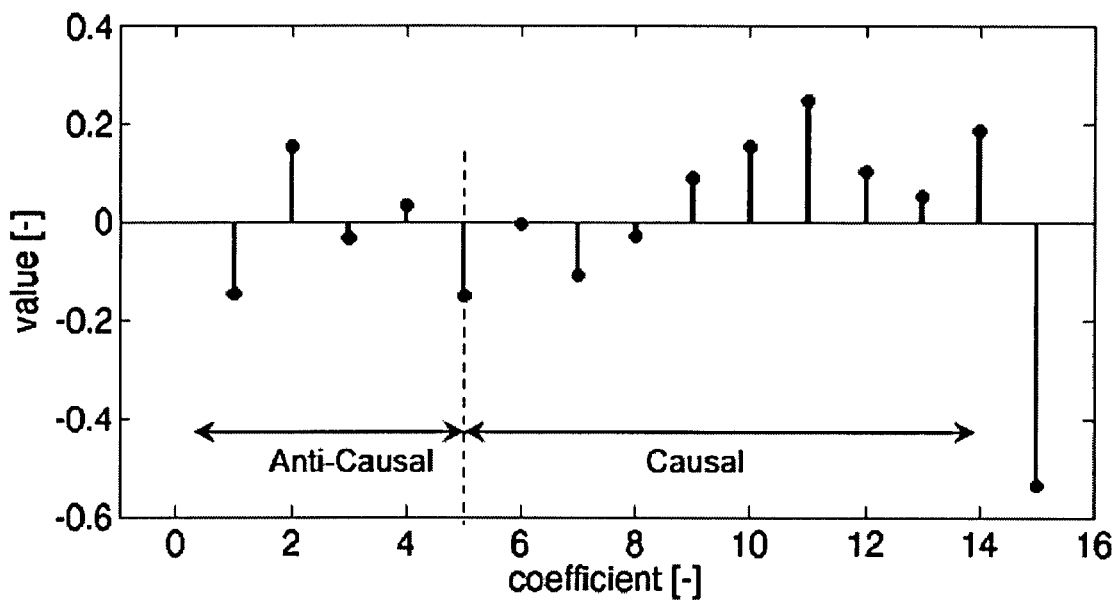
FIG. 7 depicts filter coefficients of a finite impulse response filter.

The trained filter coefficients $g_i$ are plotted in FIG. 7 with a non-causal part n1=5 and a causal part n2=10, providing 15 coefficients in total.

Figure 8:
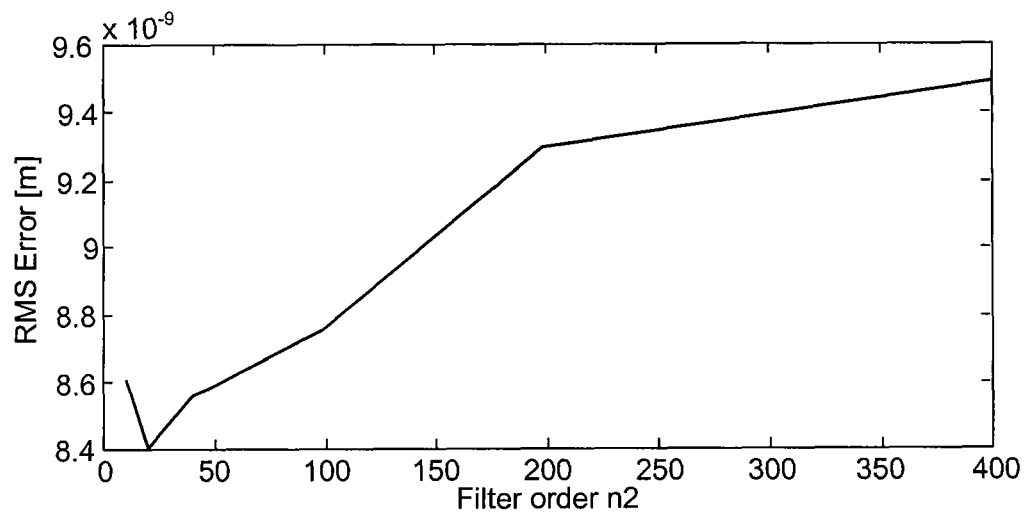
FIG. 8 depicts a relation between remaining error and an order of the finite impulse response filter.

When the FIR filter is trained at the same setpoint at which its performance is evaluated, an increasing filter order would result in better performance. A higher order (nth order) filter would then reproduce the data $f_{ilc}$ of n samples exact. When however such high order filter is used at a setpoint which is different from the training setpoint, an optimum in filter order can be observed. Above this optimum the training data is overfitted, which results in worse performance as data of the setpoint, which is too far away in time to be relevant for the feedforward at a certain moment in time, is taken into account in the filter. This can be seen from FIG. 8 where the RMS values of the measured error are plotted against filter order. Here, the FIR filter is trained at a fixed data set from three setpoints. The non-causal filter order is fixed to 5 samples. The causal filter order is increased from 5 to 400. An optimum where a lowest error is achieved, appears around 10 samples.

The above enables use of learned data in case the setpoint changes i.e. in the example of a lithographic apparatus stage positioning, when the stages perform different moves. Without being robust to setpoint variations, the use of ILC would be difficult, as for each possible setpoint signal, a feedforward would have to be learned. The concept described here proposes a way to handle setpoint variations with a generic FIR filter which can e.g. be added parallel to the conventional feedforward controller. Due to simple operations of the FIR filter, implementation may be relatively easy. Experiments have shown that substantially zero-settling time of a tracking error can be realised in scanning direction of the stage. Thereby, throughput of the lithographic apparatus may be improved.

Further, to account for position dependent dynamics, a use of different position dependent FIR filters can be thought of. The filter coefficients themselves may become an explicit function of the position (g(x,y)). All filter coefficients are then updated during each sample time resulting in a position dependent filter. Interpolation between a limited amount of FIR filters is possible.

Figure 9:
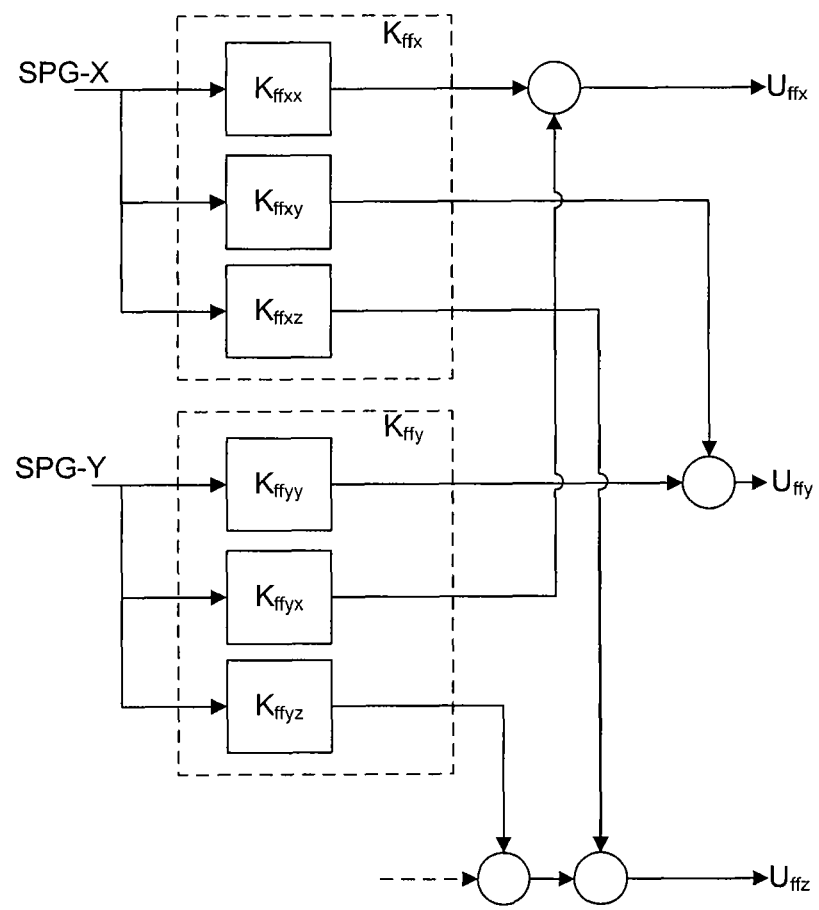
FIG. 9 depicts feedforwards of a multi input, multi output control system.

Although in the above, a single input, single output system has been described (e.g. a stage positioning in a single dimension), the concept described here may be applied in a multi input multi output control system as illustrated with reference to FIG. 9. In such multi input multi output control system, a plurality of (cross) feedforwards may have been provided to address cross effects such as cross talk, etc. From a setpoint generator signal, such as SPG-X, SPG-Y in the X respectively Y dimension, feedforward signals for an X, Y and Z dimension are obtained by respective feedforwards $K_{ffxx}$, $K_{ffxy}$, $K_{ffxz}$, and $K_{ffyy}$, $K_{ffyx}$, $K_{ffyz}$ respectively. Such setup can be extended to as many variables as desired, whereby a number of cross feedforwards may increase with an increase in variables to be controlled (such as dimensions, rotations, positions, speeds, accelerations, etc.) In such systems, iterative learning control would provide for an adequate way to obtain feedforwards to compensate for such cross effects. However, numerous situations may occur because the multiple inputs and multiple outputs will result in many more different situations (combinations of setpoints, outputs, etc.) to cope with. Therefore, many different situations would have to be learned which may make such systems complex and difficult to implement. Because of the robustness against setpoint variations, the principle described in this document may provide adequate feedforward compensations here.

Figure 10:
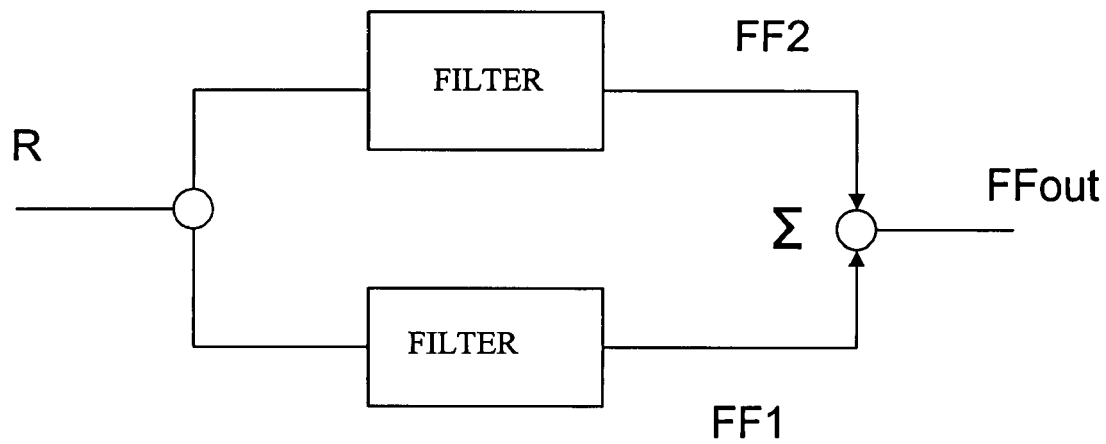
FIG. 10 depicts a highly schematic control diagram of a feedforward forming part of an embodiment of the invention.

In a further embodiment, as described with reference to FIG. 10, two feedforward output signals FF1, FF2 have been iteratively learned according to block 200 of FIG. 5B for respective opposite polarities, directions (or other parameters of the setpoint signal, thereby, e.g. directional differences in a stage positioning system can be take into account). Processes shown in blocks 210 and 220 according to FIG. 5B are performed for both feedforward output signals FF1, FF2 and their respective values of the setpoint signal R, to thereby provide respective feedforward transfer functions of the control system for respective polarities of the setpoint signal. A selector may be provided to select either one of the feedforward signals FF1, FF2 depending on a polarity, direction or other parameter of the setpoint signal, thereby providing a different filter depending on the sign/polarity of the setpoint signal. Alternatively both filter outputs may be summed by a summation as indicated by Σ in FIG. 10, thereby initialization effects that would occur in a case where an input of the filters would be switched (possibly resulting in initialization errors) may be largely prevented. Thus, a feedforward may be provided which is robust against setpoint variations, while taking account of the learned differences for the different setpoint signal polarities. Similarly such polarity may also be considered in a single acceleration phase, dependent on a polarity of a derivative of acceleration (jerk).

Different from the process of fitting a filter relation on the learned feedforward signal and the corresponding setpoint signal, alternatively the filter g can directly be determined from the measured error signal and the corresponding setpoint signal thereby omitting the learning process. The least squares problem is rewritten in terms of tracking error:

$$e = P_S \cdot R \cdot g$$

Herein matrix $P_S$ is a Toeplitz matrix representing the process sensitivity dynamics.

As outlined above, the feedforward as described in this document may be implemented in a lithographic apparatus as for example described with reference to FIG. 1, e.g. by having a processing device thereof provided with suitable program instructions to perform the described steps, thereby e.g. providing a control system to control a position quantity (e.g. a position, speed, acceleration, and/or jerk) of a stage such as the substrate stage WT or the patterning device table MT.

An embodiment of the invention may further be implemented in a device manufacturing method to manufacture a device such as a semiconductor device, processing unit, integrated circuit, electronic apparatus, etc. the method including projecting by an irradiation beam a pattern from a patterning device MA onto a substrate W; developing the irradiated substrate W; and manufacturing a device from the developed substrate, wherein at least one of the patterning device MA and the substrate W is held by a stage (e.g. patterning device table MT and substrate table WT respectively), a position of the stage being controlled by a control system having a feedforward transfer function,
the feedforward transfer function being determined by: a) iteratively learning by iterative learning control for a given setpoint signal a feedforward output signal of the control system (200); b) determining a relation between the learned feedforward output signal and the setpoint signal (210); and c) applying the relation as the feedforward transfer function of the control system (220).

Although embodiments of the invention have been described above in a context of lithography, and in particular in a context of stage positioning, any other accurate control application may benefit from the invention as described here.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A method for determining a feedforward transfer function of a control system in a lithographic apparatus, comprising:
    iteratively learning a first, feedforward output signal of the control system using an iterative learning control for a first setpoint signal and a third feedforward output signal for a third setpoint signal;
    determining a feedforward transfer function from the first and third feedforward output signals and the first and third setpoint signals;
    using the feedforward transfer function to determine a second feedforward output signal for a second setpoint signal; and
    controlling movement of a stage using the second feedforward output signal, wherein the control system comprises a stage control system.

2. The method according to claim 1, wherein the iteratively learning step comprises:
    applying the first setpoint signal to the control system, thereby providing as the first feedforward output signal an approximation of the first feedforward output signal;
    recording an error signal of the control system;
    determining from the error signal and the approximation of the first feedforward output signal a subsequent approximation of the first feedforward output signal;
    iteratively repeating an applying the first setpoint, recording, and determining from the error signal steps applying each subsequent approximation of the first feedforward output signal as the approximation of the first feedforward output signal in a subsequent repetition; and
    providing as the first feedforward output signal the approximation thereof which has been determined in a last repetition.

3. The method according to claim 1, wherein the feedforward transfer function comprises a finite impulse response filter.

4. The method according to claim 3, wherein a time length of the finite impulse response filter is derived from a time length of the first feedforward output signal.

5. The method according to claim 1, wherein the feedforward transfer function comprises an acausal relation.

6. The method according to claim 1, wherein a third feedforward output signal is iteratively learned in the iteratively learning step for a third setpoint signal having opposite polarity as the first setpoint signal and wherein determining a feedforward transfer function, using, and applying steps are performed for the first and third feedforward output signals and the first and third setpoint signals so as to provide respective feedforward transfer functions of the control system for respective polarities of the first setpoint signal.

7. The method according to claim 1, wherein the control system comprises a multi input multi output control system, the feedforward transfer function of the control system including a cross feedforward transfer function in the multi input multi output control system.

8. The method according to claim 1, wherein applying the feedforward transfer function of the control system includes applying the feedforward transfer function in combination with the first feedforward output signal as the feedforward transfer function of the control system.

9. A lithographic apparatus comprising:
    a processing device to determine a feedforward transfer function of a control system, the processing device including instructions to:
        iteratively learn a first feedforward output signal of the control system using an iterative learning control for a first setpoint signal an a third feedforward output signal for a third setpoint signal;
        determine a feedforward transfer function from the first and third feedforward output signals and the first and third setpoint signals;
        use the feedforward transfer function to determine a second feedforward output signal for a second setpoint signal; and
        control movement of a stage using the second feedforward output signal, wherein the control system comprises a stage control system.

10. The lithographic apparatus according to claim 9, wherein the instructions to itertively learn include instructions to:
    apply the first setpoint signal to the control system, thereby providing as the first feedforward output signal an approximation of the first feedforward output signal;
    record an error signal of the control system;
    determine from the error signal and the approximation of the first feedforward output signal a subsequent approximation of the first feedforward output signal;
        iteratively repeat the instructions to apply the first setpoint signal, the instructions to record, and the instructions to determine from the error signal applying each following approximation of the first feedforward output signal as the approximation of the first feedforward output signal in a subsequent repetition; and
    provide as the first feedforward output signal the approximation thereof which has been determined in a last repetition.

11. The lithographic apparatus according to claim 9, wherein the feedforward transfer function comprises a finite impulse response filter.

12. The lithographic apparatus according to claim 11, wherein the processing device is programmed to have a time length of the finite impulse response filter derived from a time length of the first feedforward output signal.

13. The lithographic apparatus according to claim 9, wherein the processing device is configured such that the feedforward transfer function comprises an acausal filter.

14. The lithographic apparatus according to claim 9, wherein the instructions to iteratively learn include instructions to iteratively learn a third feedforward output signal for a third set point signal that is an opposite polarity of the first setpoint signal, and wherein the instructions to determine a feedforward transfer function, to use, and to apply include instructions to determine the feedforward transfer function and apply the feedforward transfer function for the first and third feedforward output signals and first and third setpoint signals so as to provide respective feedforward transfer functions of the control system for respective polarities of the first setpoint signal.

15. The lithographic apparatus according to claim 9, wherein the control system comprises a multi input multi output control system, the feedforward transfer function comprising a cross feedforward transfer function in the multi input multi output control system.

16. The lithographic apparatus according to claim 9, further comprising:
an illumination system configured to condition a radiation beam;
a patterning device support constructed to support a patterning device, the patterning device capable of imparting the radiation beam with a pattern in its cross-section to form a patterned radiation beam;
a substrate support constructed to hold a substrate; and
a projection system configured to project the patterned radiation beam onto a target portion of the substrate.

17. The lithographic apparatus according to claim 16, wherein the stage control system comprises at least one of the substrate support or the patterning device support.

18. The lithographic apparatus according to claim 9, wherein applying the feedforward transfer function of the control system includes applying the feedforward transfer function in combination with the first feedforward output signal as the feedforward transfer function of the control system.

19. A method for manufacturing a device, comprising:
patterning a beam of radiation with a patterning device;
projecting the patterned beam of radiation onto a substrate;
developing the substrate irradiated with the projected patterned beam of radiation; and
manufacturing a device from the developed substrate,
wherein at least one of the patterning device or the substrate is held by a stage, a position of the stage controlled by a control system including a feedforward transfer function, the feedforward transfer function determined by:
iteratively learning a first feedforward output signal of the control system using an iterative learning control for a first setpoint signal and a third feedforward output signal for a third setpoint signal;
determining a feedforward transfer function from the first and third feedforward output signals and the first and third setpoint signals;
using the feedforward transfer function to determine a second feedforward output signal for a second setpoint signal; and
controlling movement of the stage using the second feedforward output signal.

20. The method according to claim 19, wherein the iteratively learning step comprises:
applying the first setpoint signal to the control system, thereby providing as the first feedforward output signal an approximation of the first feedforward output signal;
recording an error signal of the control system;
determining from the error signal and the approximation of the first feedforward output signal a subsequent approximation of the first feedforward output signal;
iteratively repeating the applying the first setpoint signal, recording, and determining from the error signal steps applying each following approximation of the first feedforward output signal as the approximation of the first feedforward output signal in a subsequent repetition; and
providing as the first feedforward output signal the approximation thereof which has been determined in a last repetition.

21. The method according to claim 20, wherein the feedforward transfer function comprises a finite impulse response filter.

22. The method according to claim 21, wherein a time length of the finite impulse response filter is derived from a time length of the first feedforward output signal.

23. The method according to claim 19, wherein the feedforward transfer function comprises an acausal relation.

24. The method according to claim 19, wherein a third feedforward output signal has been iteratively learned in the iteratively learning step for a third setpoint signal that is a signal having opposite polarity as the first setpoint signal, the determining the feedforward transfer function, using, and applying steps being performed for the first and third feedforward output signals and the first and third setpoint signals so as to provide respective feedforward transfer functions of the control system for respective polarities of the first setpoint signal.

25. The method according to claim 19, wherein the control system comprises a stage control system.

26. The method according to claim 19, wherein the control system comprises a multi input multi output control system, the feedforward transfer function comprising a cross feedforward transfer function in the multi input multi output control system.

27. The method according to claim 19, wherein applying the feedforward transfer function of the control system includes applying the feedforward transfer function in combination with the first feedforward output signal as the feedforward transfer function of the control system.

* * * * *